United States Patent
Nakayama et al.

(10) Patent No.: US 9,588,183 B2
(45) Date of Patent: Mar. 7, 2017

(54) SHORT-CIRCUIT INSPECTION METHOD FOR SECONDARY CELL

(75) Inventors: Takayuki Nakayama, Nissin (JP); Akio Minakuchi, Okazaki (JP)

(73) Assignee: TOYOTA JIDOSHA KABUSHIKI KAISHA, Toyota-shi (JP)

(*) Notice: Subject to any disclaimer, the term of this patent is extended or adjusted under 35 U.S.C. 154(b) by 124 days.

(21) Appl. No.: 14/417,473

(22) PCT Filed: Jul. 27, 2012

(86) PCT No.: PCT/JP2012/069187
§ 371 (c)(1),
(2), (4) Date: Jan. 26, 2015

(87) PCT Pub. No.: WO2014/016956
PCT Pub. Date: Jan. 30, 2014

(65) Prior Publication Data
US 2015/0212162 A1    Jul. 30, 2015

(51) Int. Cl.
*H02J 7/00* (2006.01)
*G01R 31/36* (2006.01)
*G01R 31/02* (2006.01)

(52) U.S. Cl.
CPC ....... *G01R 31/3627* (2013.01); *G01R 31/025* (2013.01); *G01R 31/3641* (2013.01)

(58) Field of Classification Search
CPC ............ G01R 31/3627; G01R 31/3641; G01R 31/025; H02J 7/007

USPC .................. 320/132, 133, 136; 324/426, 430
See application file for complete search history.

(56) References Cited

U.S. PATENT DOCUMENTS

2010/0194398 A1* 8/2010 Kawasumi .............. H01M 2/34
                                                            324/430

FOREIGN PATENT DOCUMENTS

| JP | 2009252459 A | 10/2009 |
|----|--------------|---------|
| JP | 2011-018482 A | 1/2011 |
| JP | 2011-069775 A | 4/2011 |

* cited by examiner

*Primary Examiner* — Edward Tso
*Assistant Examiner* — Aaron Piggush
(74) *Attorney, Agent, or Firm* — Sughrue Mion, PLLC

(57) ABSTRACT

A secondary battery is charged at a predetermined charging current density to a first SOC, and discharged at a discharging current density same as the charging current density to a second SOC smaller than the first SOC, the voltage thereof is stabilized by leaving the secondary battery for a predetermined time while maintaining the secondary battery in the range of ±3° C. from the battery temperature of the secondary battery that has been discharged, the secondary battery the voltage of which has been stabilized is self-discharged under room temperature, and the presence or absence of a short-circuit is detected on the basis of a voltage drop amount after a given time.

4 Claims, 5 Drawing Sheets

SHORT-CIRCUIT INSPECTION METHOD FOR SECONDARY CELL

CROSS REFERENCE TO RELATED APPLICATIONS

This is a National Stage of International Application No. PCT/JP2012/069187 filed Jul. 27, 2012, the contents of which are incorporated herein by reference in its entirety.

TECHNICAL FIELD

The present invention relates to a method for inspecting short-circuits in a secondary battery.

BACKGROUND ART

JP 2011-69775 A discloses a technique of inspecting a fine short circuit in which a battery is charged to a first SOC, discharged to a second SOC lower than the first SOC, and the inspection is performed keeping the battery temperature low.

CITATION LIST

Patent Literature

PTL 1: JP 2011-69775 A

SUMMARY OF INVENTION

Technical Problem

In the technique of JP 2011-69775 A, the discharge process is performed with low rate in which the discharging current density is lower than the charging current density. Consequently, it takes long time to finish the discharging process, and it needs long time to finish the inspection process for short-circuits. Also, the inspection process is performed in a condition that the battery temperature is low to stabilize the voltage thereof after the discharging process. Thus, a low temperature storage facility is needed to maintain the low battery temperature, i.e., it needs facility costs.

Technical Solutions

A first embodiment of the present invention relates to a method for inspecting short-circuit in a secondary battery, including: charging the secondary battery to a first SOC with a predetermined charging current density; discharging the secondary battery to a second SOC lower than the first SOC with a discharging current density being same with the charging current density; regulating a voltage of the secondary battery by leaving for a predetermined time keeping a battery temperature of the secondary battery in a range of ±3° C. from the battery temperature after discharging; and self-discharging the secondary battery, the voltage of which is regulated, under room temperature and inspecting whether the short-circuit exists on the basis of an amount of voltage drop after a given time.

Due to the structure, before the short-circuit inspection, the voltage rise caused by the voltage jump is suppressed, whereby the amount of the voltage drop can be detected with high sensitivity and the operation time required for the inspection can be shortened. Moreover, the short-circuit inspection is performed under room temperature, so that the extra facility costs can be avoided.

In a preferable embodiment, the regulating is operated in a condition that the battery temperature is kept in room temperature and in the range of ±3° C. from the battery temperature after discharging, and the given time is not less than 24 hours.

More advantageously, in the discharging, the second SOC is not more than 10%, or low SOC.

As the voltage remarkably changes in the low SOC condition, the inspection accuracy for fine short-circuits can be improved.

The method according to the present invention advantageously includes aging the secondary battery under high-temperature atmosphere after charging the secondary battery.

As the secondary battery is aged under high-temperature condition, the chemical materials inside the secondary battery are activated, and chemical short-circuits in the secondary battery are accelerated, thereby enhancing the determination accuracy for the fine short-circuit.

The first SOC is advantageously not less than 3.6 V. Thus, foreign materials in the secondary battery are melted in the aging process with high-temperature condition, so that short-circuits to be inspected are activated.

Advantageous Effects of Invention

According to the present invention, it is possible to inspect a finer short-circuit than conventional art, to shorten an operating time required for inspecting short-circuits and to avoid increasing facility costs.

DESCRIPTION OF EMBODIMENTS

Figure 1:
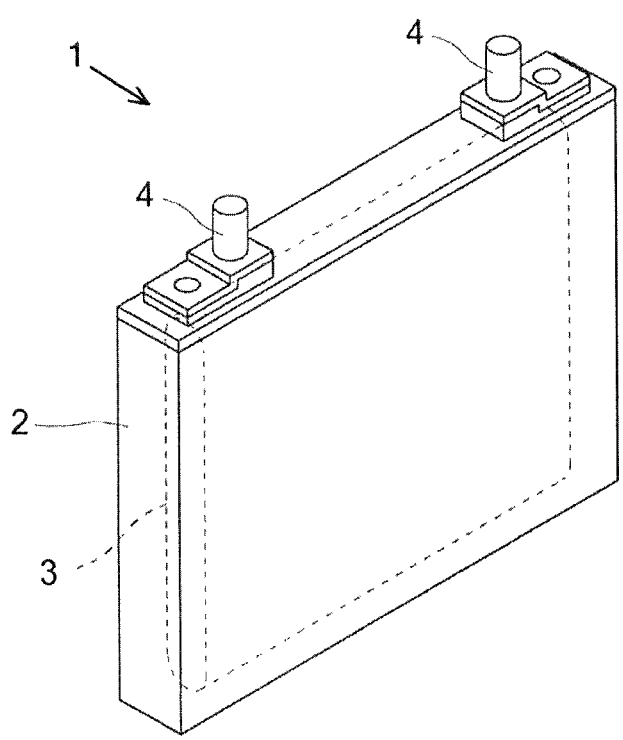
FIG. 1 is a schematic view of a secondary battery.

FIG. 1 shows a schematic structure of a secondary battery 1. The secondary battery 1 is a rechargeable battery, e.g., a lithium ion secondary battery having a square shape. The secondary battery 1 includes a sealed casing 2 containing an electrode body 3 as a charging/discharging element. The electrode body 3 is connected with two outer terminals 4 as a positive electrode and a negative electrode, both of which are fixed to the casing 2 projecting outward therefrom.

The electrode body 3 includes a positive electrode current collector, a separator and a negative electrode current collector, in which these elements are stacked and wound. On the positive and negative electrode current collectors, a positive electrode mixture and a negative electrode mixture are applied, respectively. For example, in the lithium ion secondary battery, the positive electrode mixture containing a positive electrode active material with a lithium ion, a conductive assistant and the like is coated on the positive electrode current collector, and the negative electrode mixture containing a negative electrode active material with a carbon-based material is coated on the negative electrode current collector.

Figure 2:
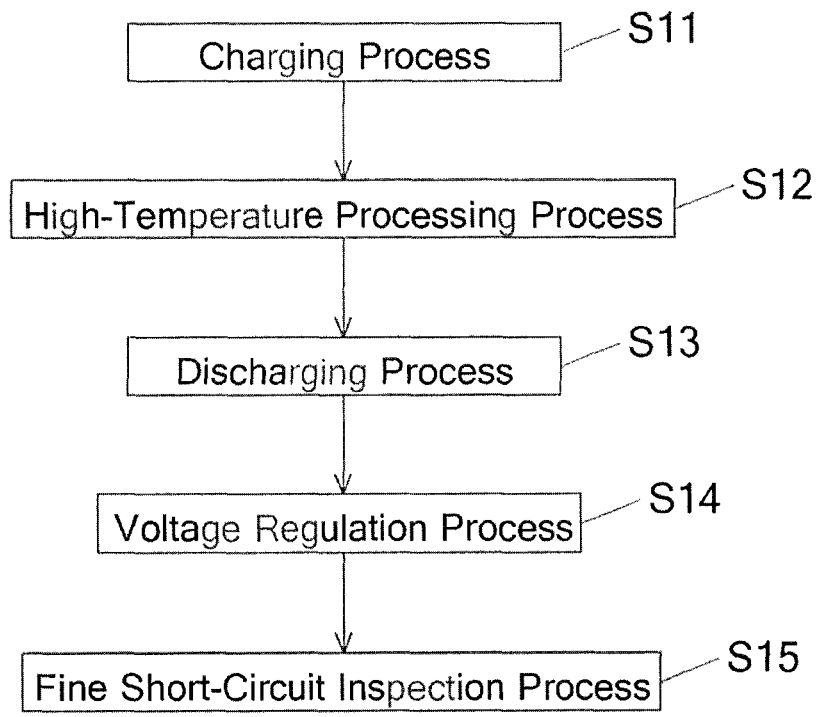
FIG. 2 is a flowchart of a process of inspecting short-circuits.

FIG. 2 shows a short-circuit inspection process S1 for the secondary battery 1. In the short-circuit inspection process S1, an inspection is performed whether fine short-circuits exist in the secondary battery 1 which has been assembled.

The short-circuit inspection process S1 includes a charging process S11, a high-temperature processing process S12, a discharging process S13, a voltage regulation process S14 and a fine short-circuit inspection process S15.

In the charging process S11, the secondary battery 1 is connected to a charging/discharging device, and charged to a first SOC with a predetermined current density. The first SOC is set as a high SOC, e.g., not less than 80%. The predetermined current density used in the charging process S11 is a C-rate not less than 0.02 [C].

The secondary battery is charged to not less than 3.6 V as the first SOC. As a result, in the following high-temperature processing process S12, foreign materials in the battery are melted and thus the occurrence of fine short-circuits is activated.

In the high-temperature processing process S12, the secondary battery 1 is maintained in a high-temperature atmosphere so that the internal chemical materials (electrode active materials) are activated. The high-temperature atmosphere is, for instance, an atmosphere higher than room temperature and lower than temperature where the separator of the secondary battery 1 does not melt, such as between 40° C. and 85° C.

As the secondary battery 1 is aged under the high-temperature atmosphere, the chemical reaction inside the secondary battery 1 is accelerated, and thus the fine short-circuit, or chemical short-circuit caused by the chemical reaction occurs actively. Therefore, the inspection accuracy in the fine short-circuit inspection process S15 can be improved.

In the discharging process S13, the secondary battery 1 is connected to the charging/discharging device, and discharged to a second SOC with the same current density as in the charging process S11. In other words, in the discharging process S13, the high rate discharging (not less than 0.02 C) is operated. The second SOC is set as a low SOC, e.g., not more than 20%.

Figure 3:
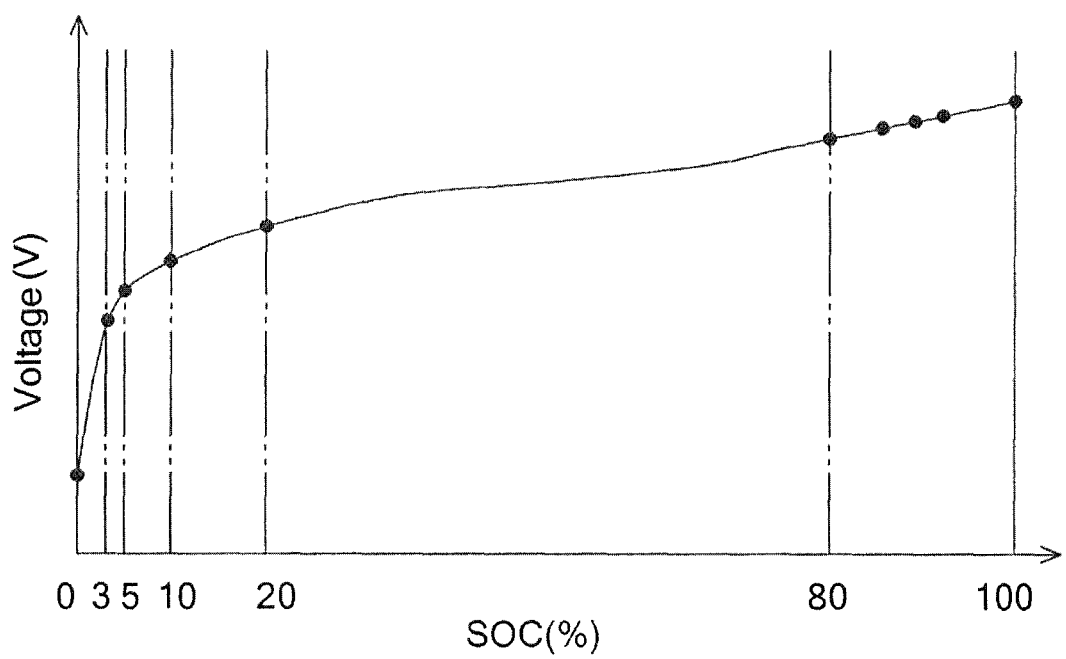
FIG. 3 is a graph showing a discharging curve of the secondary battery.

FIG. 3 illustrates a discharging curve of the secondary battery 1, in which the horizontal axis represents the SOC (%), and the vertical axis represents the voltage (V). As illustrated in FIG. 3, it is preferable to discharge to the degree being not more than 10% where the change of voltage largely appears, namely the tangent voltage over SOC is large. Particularly, it is more preferable to discharge to around 3 to 5% in the vicinity of the inflection point.

As described above, in the discharging process S13, the secondary battery 1 is discharged to the low SOC where the voltage drop (variation) is large, and therefore the inspection sensitivity for defective products can be enhanced.

In the voltage regulation process S14, the secondary battery 1 is left for a predetermined time under room temperature (between 10° C. and 30° C.) and in the range of ±3° C. from the battery temperature after the discharging process S13. Thus, the voltage of the secondary battery 1 can be stabilized. Due to the process, a voltage jump of the secondary battery 1 after the discharging process (voltage rise caused by a diffusion of the electrode active materials) can be suppressed.

Figure 4:
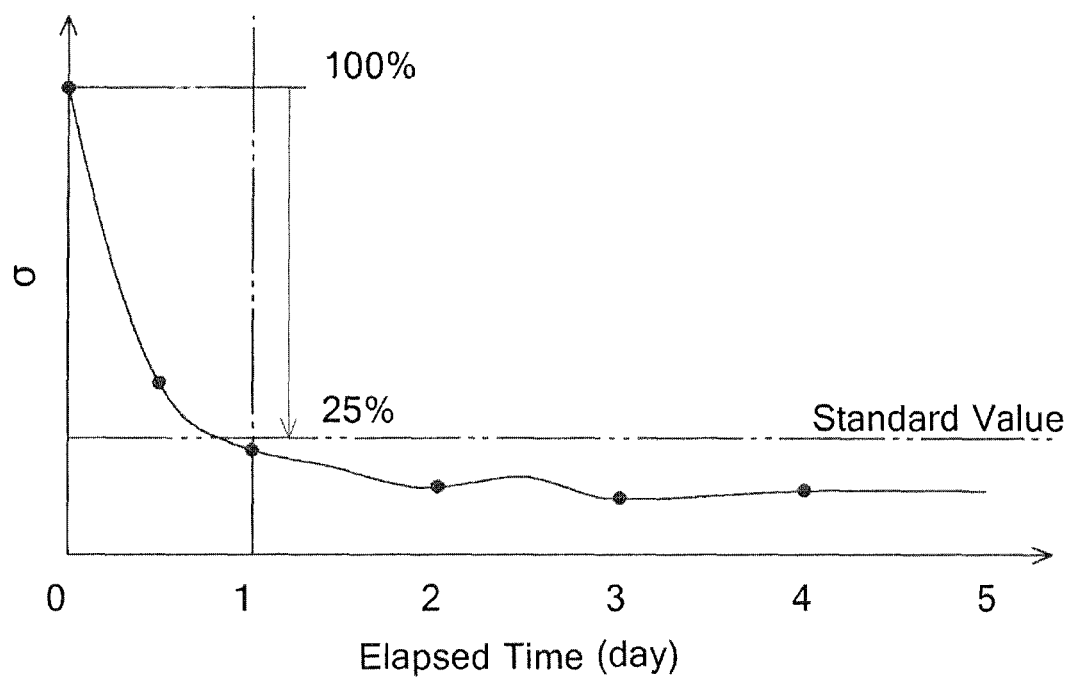
FIG. 4 is a graph showing a relationship between an elapsed time in a voltage regulation process and a variation in voltage among the secondary batteries.

FIG. 4 shows the results of measurement for a variation in voltage of the secondary batteries 1, which has passed the charging process S11, the high-temperature processing process S12 and the discharging process S13. In FIG. 4, the horizontal axis represents an elapsed time (day) and the vertical axis represents a dimension of variation ($\sigma$).

As shown in FIG. 4, after passing one day, the dimension of variation became lower than a standard value. The standard value was, for example, a quarter of the dimension of variation when the discharging process S13 finished. Therefore, the aging time in the voltage regulation process S14 is preferably not less than one day (24 hours), and more preferably not less than two days (48 hours) considering a production tolerance between the battery cells.

As the secondary battery 1 after the discharging process is aged to regulate the battery voltage in the voltage regulation process S14, i.e., maintaining the battery until the internal chemical materials are stabilized, the variation in voltage of the batteries 1 caused by the voltage rise can be suppressed. Moreover, maintaining the temperature of the secondary battery 1 after the discharging process results in suppressing the variation in voltage caused by the change of battery temperature, thereby improving the inspection accuracy.

In the fine short-circuit inspection process S15, the secondary battery 1 is self-discharged under room temperature and the voltage thereof is measured. The inspection whether a fine short circuit exists is performed on the basis of the difference between the voltage of that secondary battery 1 and the voltage of any one of secondary batteries in non-defective group.

Noted that the voltage of each secondary battery 1 is set in zero when the voltage regulation process S14 is finished and transited to the fine short-circuit inspection process S15. The voltage of the secondary battery 1 after passing a given time is measured and if the difference between the measured voltage and the voltage of the secondary battery in the non-defective group is larger than a threshold, the secondary battery 1 is determined as a defective.

In this embodiment, the fine short-circuit inspection process S15 is operated in the condition that the variation in voltage of each secondary battery 1 is suppressed in the voltage regulation process S14, so that the threshold used to determine whether the secondary battery is non-defective or defective can be set small. In other words, the voltage drop of the secondary battery 1 with defects including the fine short-circuit can be detected with high sensitivity, whereby the operation time required for inspection can be shortened.

Figure 5:
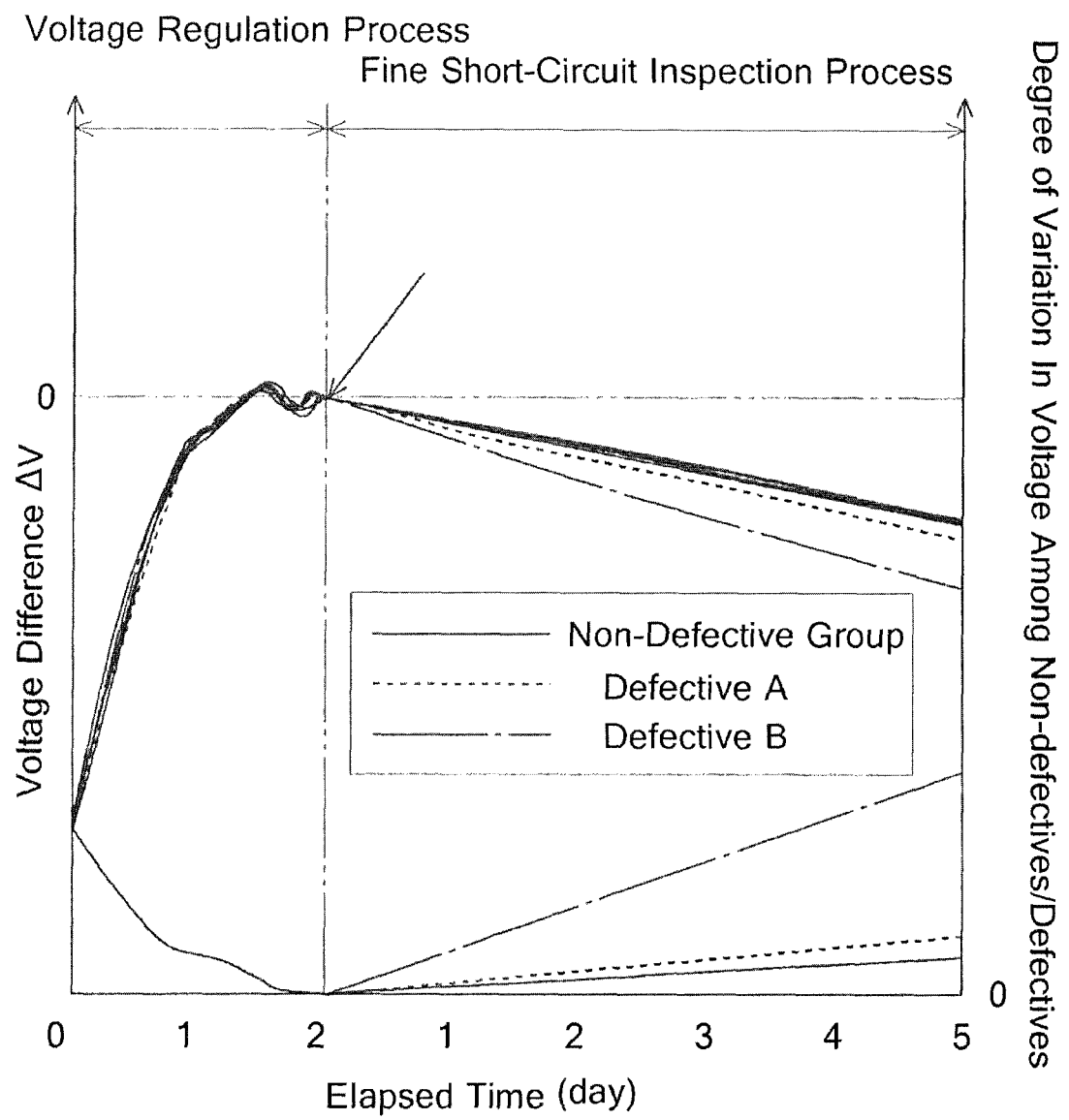
FIG. 5 is a graph showing relationships in a fine short-circuit inspection process between an elapsed time, and a voltage drop and a variation in voltage among non-defective group and defectives.

FIG. 5 shows the results of a determination test for the defectives according to the fine short-circuit inspection process S15. In FIG. 5, the horizontal axis represents an elapsed time (day) and the vertical axis represents a voltage change ($\Delta V$) and a degree of variation in voltage. Further, the voltage changes were measured from the end of the discharging process S13 to the fine short-circuit inspection process S15 passing through the voltage regulation process S14, and the degrees of variation in voltage were measured among the non-defective group and the defectives A and B.

In the determination test, two types of secondary batteries were prepared; multiple non-defectives, and multiple defectives including short-circuits forcedly occurred. These secondary batteries were self-discharged for five days, and the voltage difference between the defectives and the non-defectives was measured for detection of the fine short-circuits. The prepared defectives were a defective A with small short-circuit resistance and a defective B with large short-circuit resistance.

As shown in FIG. 5, the variation in voltage of the non-defectives was small, and there remarkably appeared the difference between the voltage drops of the non-defectives and those of defectives A and B after passing five days, whereby the determination between the non-defectives and the defectives can be easily accomplished.

The reason is that each of the secondary batteries 1 passed the voltage regulation process S14 which cancelled the voltage jumps after the discharging process, and the secondary batteries 1 were transited to the fine short-circuit process S15.

It should be noticed that the fine short-circuit process S15 in the determination test took five days, however, if the voltage difference between the non-defectives group and the defective becomes large enough to be determined, the time required for the inspection may be shorter than that.

As described above, the short-circuit inspection process S1 includes the voltage regulation process S14 which suppresses the variation in voltages of the secondary batteries and improves the determination accuracy in the fine short-circuit inspection process S15. Therefore, the operation time required for the short-circuit inspection process S1 can be shortened.

In the discharging process S13, the discharging is performed by the high rate current density, thereby shortening the time required for the discharging process S13. Moreover, the discharging process S13 is performed to the low SOC, thereby improving the determination accuracy in the fine short-circuit inspection process S15.

Figure 6:
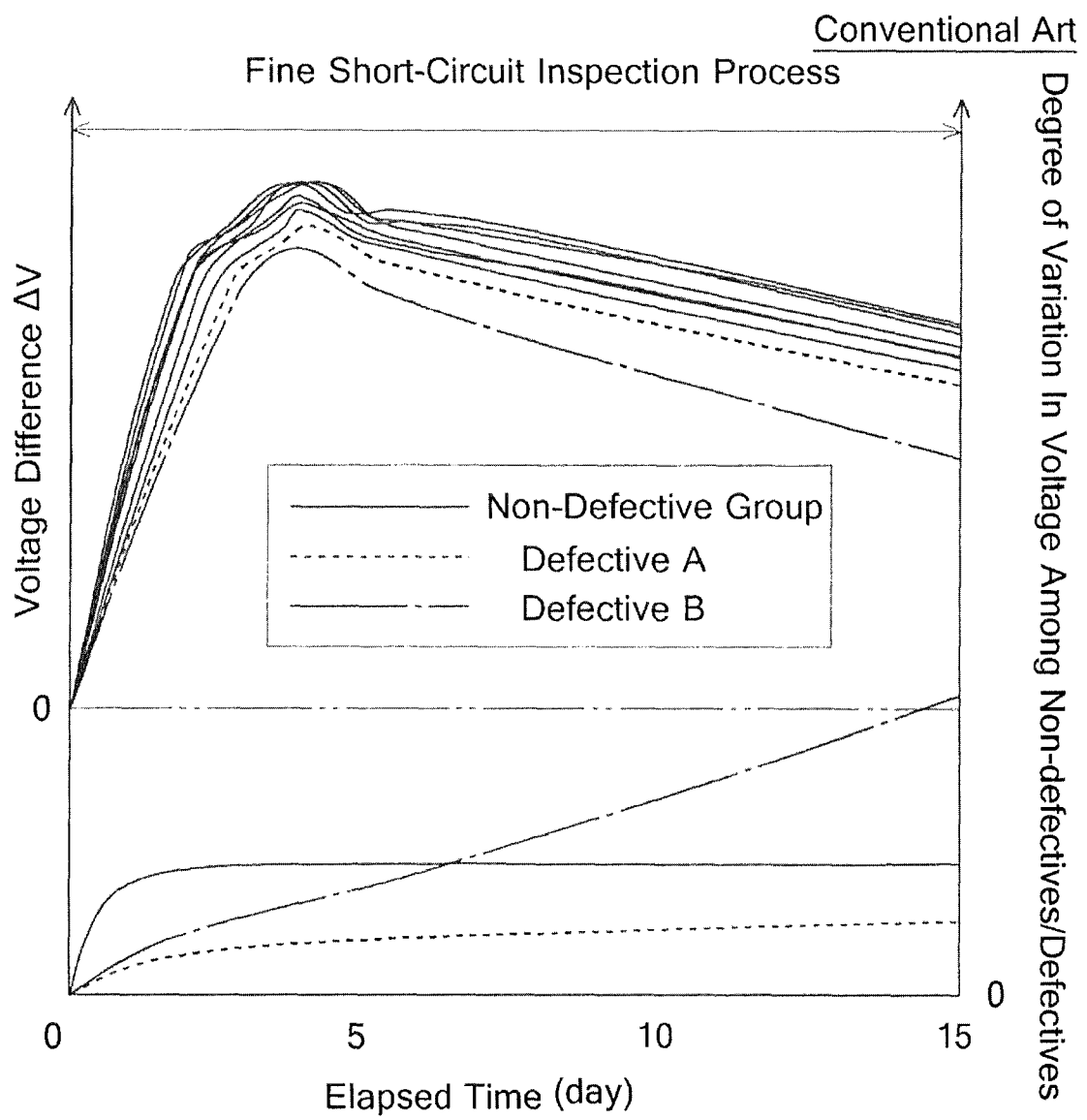
FIG. 6 is a graph showing relationships in a conventional fine short-circuit inspection process between an elapsed time, and a voltage drop and a variation in voltage among non-defective group and defectives.

FIG. 6 shows the results of a determination test for the defectives according to the conventional technique of inspecting fine short-circuits, in which the non-defective group and the defectives A and B as the embodiment according to the present invention. The conventional fine short-circuit inspection process was performed after a discharging process in which the secondary batteries were discharged with low rate. In FIG. 6, the horizontal axis represents an elapsed time (day) and the vertical axis represents a voltage change (ΔV) and a degree of variation in voltage, and the curves represent the voltage changes during the fine short-circuit inspection, and the degrees of variation in voltage among the non-defective group and the defectives A and B.

As shown in FIG. 6, as the variation in voltage of the non-defectives was large, and as a result; it took long time to detect the voltage difference between the non-defectives and the defective A with small the short-circuit. To avoid the misdetection for defectives, there needs to leave the secondary batteries until the voltage difference in the non-defectives become smaller than the voltage difference among the non-defectives and the defective A, and thus it needs to take long time for the inspection test.

Consequently, due to the short-circuit inspection process S1, the finer short-circuit can be detected and the shorter inspection time can be remarkably achieved compared to the conventional process.

INDUSTRIAL APPLICABILITY

The present invention can be applicable to a process for inspecting short-circuits of a secondary battery.

DESCRIPTION OF NUMERALS

1: secondary battery, 2: casing, 3: electrode body, 4: outer terminal

The invention claimed is:

1. A method for inspecting short-circuit in a secondary battery, comprising:
   charging the secondary battery to a first SOC with a predetermined charging current density;
   discharging the secondary battery to a second SOC lower than the first SOC with a discharging current density that is the same as the charging current density;
   regulating a voltage of the secondary battery by leaving the secondary battery for a predetermined time at a battery temperature in a range of ±3° C. from the battery temperature of the secondary battery after discharging; and
   self-discharging the secondary battery, the voltage of which is regulated, under room temperature and inspecting whether the short-circuit exists on the basis of an amount of voltage drop after a given time, wherein
   the regulating is operated in a condition that the battery temperature is kept at room temperature and in the range of ±3° C. from the battery temperature after discharging, and the given time is not less than 24 hours.

2. The method according to claim 1, wherein
   in the discharging, the second SOC is not more than 10% of the full battery capacity.

3. A method for inspecting short-circuit in a secondary battery, comprising:
   charging the secondary battery to a first SOC with a predetermined charging current density;
   discharging the secondary battery to a second SOC lower than the first SOC with a discharging current density that is the same as the charging current density;
   regulating a voltage of the secondary battery by leaving the secondary battery for a predetermined time at a battery temperature in a range of ±3° C. from the battery temperature of the secondary battery after discharging;
   self-discharging the secondary battery, the voltage of which is regulated, under room temperature, and inspecting whether the short-circuit exists on the basis of an amount of voltage drop after a given time; and
   aging the secondary battery under high-temperature atmosphere after charging the secondary battery.

4. The method according to claim 3, wherein the first SOC is not less than 3.6 V.

* * * * *